(12) United States Patent
Callahan, Jr.

(10) Patent No.: US 6,885,247 B2
(45) Date of Patent: Apr. 26, 2005

(54) CURRENT AMPLIFIER

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/013,214

(22) Filed: Dec. 7, 2001

(65) Prior Publication Data

US 2003/0107439 A1 Jun. 12, 2003

(51) Int. Cl.[7] .................................................. H03F 3/04
(52) U.S. Cl. ...................................... 330/288; 330/296
(58) Field of Search ................................ 330/253, 257, 330/288, 290, 296, 300, 308, 311, 259

(56) References Cited

U.S. PATENT DOCUMENTS

| | | | | |
|---|---|---|---|---|
| 4,710,014 A | * | 12/1987 | Kohno | 396/229 |
| 4,713,628 A | * | 12/1987 | Nelson | 330/254 |
| 5,111,156 A | * | 5/1992 | Hachiuma | 330/257 |
| 5,602,511 A | * | 2/1997 | Woolaway | 330/282 |
| 5,691,658 A | * | 11/1997 | Klein | 327/104 |
| 5,867,066 A | | 2/1999 | Dell'Ova et al. | 330/288 |
| 5,923,217 A | * | 7/1999 | Durec | 330/288 |
| 6,028,480 A | * | 2/2000 | Seevinck et al. | 330/253 |
| 6,201,446 B1 | * | 3/2001 | Ananth | 330/261 |
| 6,208,205 B1 | * | 3/2001 | Main et al. | 330/98 |
| 6,268,772 B1 | * | 7/2001 | Chen | 330/288 |
| 6,480,178 B1 | * | 11/2002 | Itakura et al. | 345/89 |
| 6,566,955 B1 | | 5/2003 | Tang | 330/288 |
| 6,778,113 B2 | * | 8/2004 | Xu et al. | 341/144 |

* cited by examiner

Primary Examiner—Michael Tokar
Assistant Examiner—Linh V Nguyen
(74) Attorney, Agent, or Firm—David V. Carlson; Lisa K. Jorgenson

(57) ABSTRACT

A current amplifier comprising an amplifier circuit with overall negative feedback and an output current amplification circuit. In one embodiment, a photodiode provides a current to be amplified and the amplifier circuit and the output current amplification circuit are implemented using MOS technology.

48 Claims, 3 Drawing Sheets

CURRENT AMPLIFIER

BACKGROUND OF THE INVENTION

1. Field of the Invention

The present invention relates to current amplifiers, and more particularly to amplifiers for amplifying low currents with a large band-width.

2. Description of the Related Art

FIG. 1 represents such a current amplifier in a conventional application. The current to be amplified i is provided to an input A of the amplifier through a photodiode D connected to a supply voltage Vcc. When the photodiode D is, for example, used in a compact disk (CD) read head, the variations in the light intensity, and therefore the variations in the current of photodiode D, are very low. The maximum value of current i is approximately 3 $\mu$A. Furthermore, current i may vary at a frequency of approximately 1.5 MHz.

A parasitic capacitance Cp1 is present between the input A of amplifier 10 and ground GND, and a parasitic capacitance Cp2 is present between the input A and the supply voltage Vcc. These two parasitic capacitances Cp1 and Cp2 may significantly reduce the band-width of amplifier 10 and inject noise from the supply voltages in the input. To avoid these drawbacks, the input impedance of amplifier 10 must be reduced or, in other terms, the voltage of the input must be as steady as possible.

FIG. 2 represents an exemplary conventional current amplifier providing satisfactory performance for a photodiode of a CD read head. In practice, the current amplifier 10 is a current mirror with bipolar transistors. An NPN transistor Q1 forms the input transistor of the current mirror. The emitter of transistor Q1 is connected to ground GND and its base and collector receive from the photodiode D the current i to amplify. Furthermore, a constant current source 12, connected in parallel with diode D, provides a bias current I. An NPN transistor Q2, forming an output transistor of the current mirror, is connected in parallel by its base and emitter to transistor Q1. The output current of the amplifier is drawn from the collector of transistor Q2. The emitter surfaces of transistors Q1 and Q2 are indicated in brackets. Transistor Q1 has a unity surface and transistor Q2 has a surface n. Thus, the current i in photodiode D is amplified by a factor n at the collector of transistor Q2.

Such a current amplifier, formed of bipolar transistors, has an input impedance of approximately 1 k$\Omega$, which is sufficient to amplify currents of approximately 3 $\mu$A with a band-width of approximately 1.5 MHz in common cases where the parasitic capacitances are relatively low.

The digital circuits for processing the signal provided by the photodiode D, in particular for CD's, are generally realized in CMOS technology, which is inexpensive and well adapted to digital processing.

The performance of a current mirror realized in CMOS technology is insufficient to amplify low currents with a large band-width. So, in CD players, the current amplifiers of the photodiodes of the read heads are realized in bipolar technology and cannot be integrated in the same circuit as the signal processing circuit.

FIG. 3 illustrates another approach to implementing a current amplifier for CD applications in CMOS technology. This approach is disclosed in U.S. Pat. No. 5,867,066 issued on Feb. 2, 1999, to Dell'Ova, et al, and entitled "Current Amplifier" ("the '066 patent"). A circuit which has improved temperature characteristics beyond those of the '066 patent is preferred.

SUMMARY OF THE INVENTION

In accordance with one aspect of the present invention, the current amplifier is comprised of an amplifier circuit with a low-impedance input and an overall negative feedback loop, and a current amplifier circuit. In another aspect of the present invention, various components of the current amplifier are implemented using CMOS technology.

DETAILED DESCRIPTION OF THE INVENTION

The present invention provides for low power consumption, high reliability and a high signal to noise ratio in CMOS implementation of a current amplifier. Although the examples presented herein are based on amplification of a current generated by a photodiode in a CD system, the present invention may be used in other applications requiring amplification of a low current.

Figure 1:
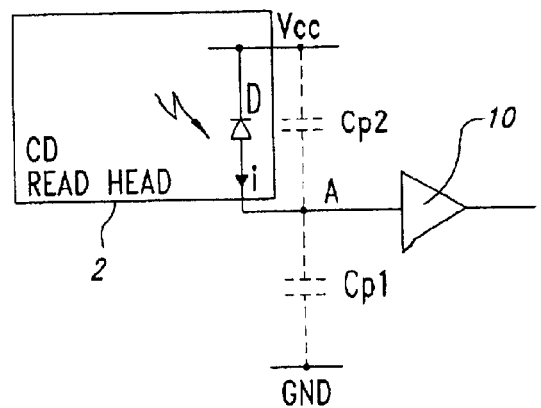
FIG. 1 represents a conventional application of a current amplifier.
Figure 2:
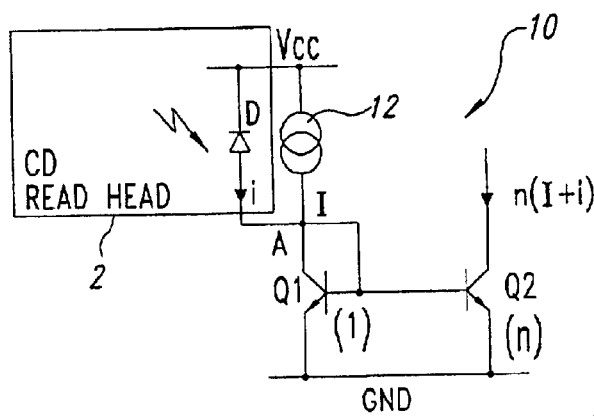
FIG. 2 represents a conventional bipolar structure of a current amplifier.
Figure 3:
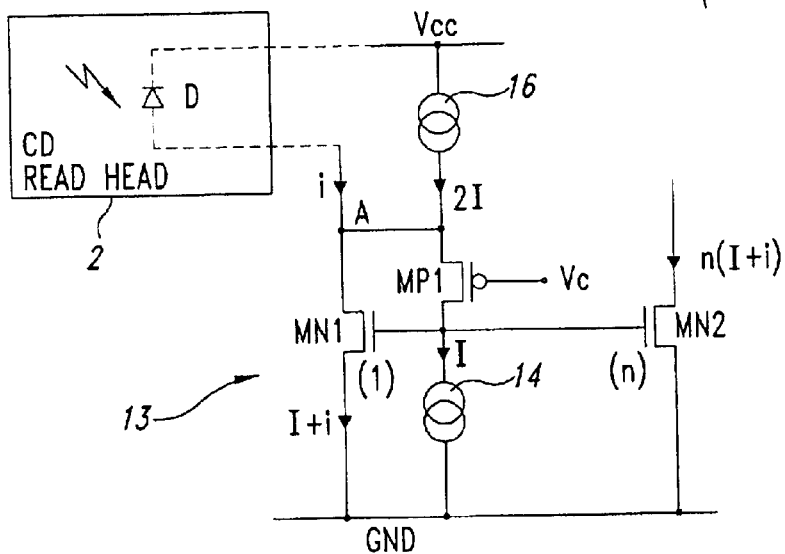
FIG. 3 represents a conventional amplifier that can be realized in CMOS technology.
Figure 4:
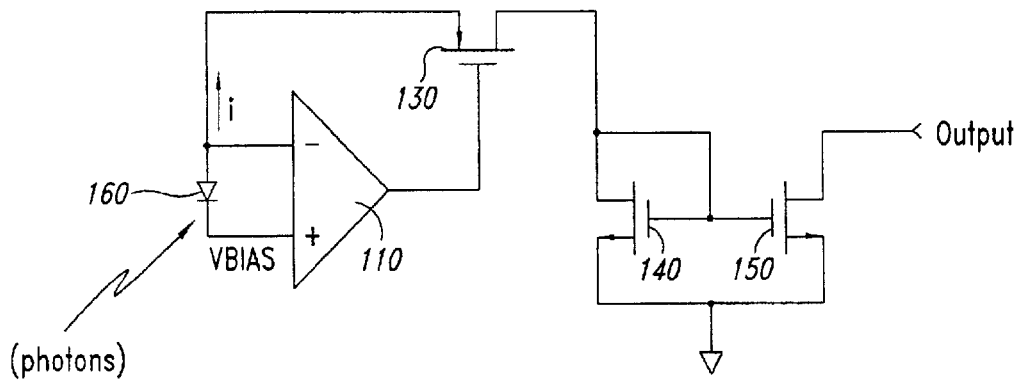
FIG. 4 represents an embodiment of a current amplifier according to the invention.

The present invention is embodied in a device 100 illustrated in the functional block of FIG. 4. An input current i to be amplified is provided at an inverting input of an operational amplifier 110. A reference voltage, such as $V_{ref}$ or $V_{bias}$, is applied to a non-inverting input of the operational amplifier 110. Negative feedback is provided by a negative feedback loop comprising a p-channel MOS transistor 130. The gate of transistor 130 is coupled to the output of operational amplifier 110. The source of transistor 130 is coupled to the inverting input of operational amplifier 110. The drain of transistor 130 is coupled to the input of a current mirror amplifier comprised of n-channel CMOS transistors 140 and 150. In one embodiment, the source of transistor 130 provides a current equal to the current i provided to the inverting input of the operational amplifier 110, assuming an ideal amplifier 110.

The drain of transistor 130 is coupled to gates of transistors 140 and 150. The drain of transistor 140 is coupled to the gate of transistor 140. The sources of transistors 140 and 150 are connected to a reference voltage. Transistor 140 will, in one embodiment, conduct a current equal to the current provided by the source of transistor 130. Transistor 150 has the same operational conditions as transistor 140. Transistor 150, however, has a conduction area that is a predetermined multiple, n, of the conduction area of transistor 140. Thus, transistor 150 will ideally draw an amplified current of n*i through its drain.

In one embodiment, photodiode 160 is the current source to supply current i based on an optical input signal. In this case, the diode 160 may be coupled between the inverting and non-inverting inputs to the amplifier 110.

Figure 5:
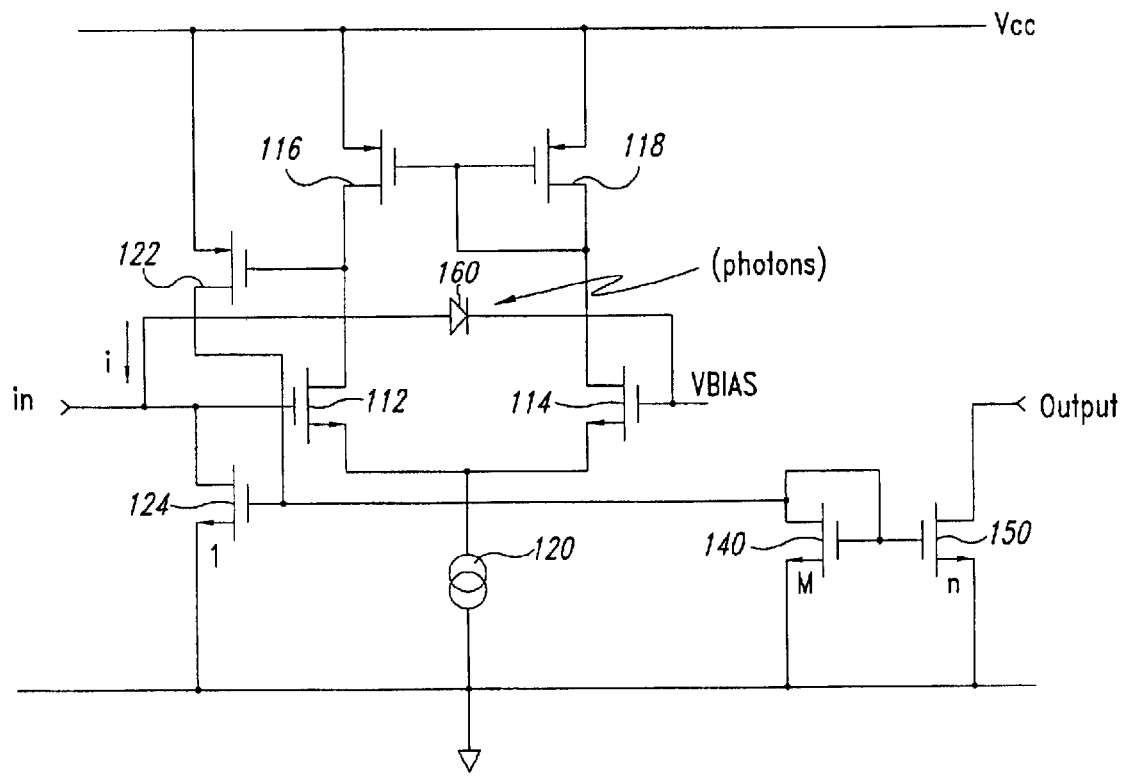
FIG. 5 represents another embodiment of a current amplifier according to the present invention.

Another embodiment of the present invention is illustrated in FIG. 5. A CMOS differential amplifier circuit is created using n-channel input transistors 112 and 114, p-channel transistors 116 and 118, and a constant current source 120. A current i to be amplified is provided at the gate of transistor 112, which functions as the inverting input of the differential amplifier circuit. Some reference voltage, such as bias voltage $V_{bias}$, is applied to the gate of transistor 114, which functions as the non-inverting input of the differential amplifier. The sources of transistors 112 and 114 are connected to constant current source 120. Transistor 116 is connected between the drain of transistor 112 and a supply voltage Vcc. Transistor 118 is connected between the drain of transistor 114 and the supply voltage Vcc. The gates of transistors 116 and 118 are connected to the drain of transistor 114.

A negative feedback loop is provided by p-channel transistor 122 and n-channel transistor 124 and n-channel transistor 140. The gate of transistor 122 is coupled to the output of the amplifier, which is the connection of the drain of transistor 112 and the drain of transistor 116. The source of transistor 122 is connected to the supply voltage Vcc. The drain of transistor 122 is connected to the gate of transistor 124. Transistor 124 is connected between the gate of transistor 112 and a reference voltage. The negative feedback loop will tend to drive the difference in voltage between the inputs of the differential amplifier circuit to zero. Thus, transistor 124 will tend to conduct a current approximately equal to the current i, and under ideal circuit components will be equal to current i.

A current mirror amplifier is formed by n-channel transistors 140 and 150. The gates of transistors 140 and 150 are connected to the gate of transistor 124. The sources of transistors 140 and 150 are connected to the reference voltage. Thus, transistors 124, 140, and 150 will have the same operating conditions. Assuming transistor 124 has a conduction area of unity and transistor 140 has a conduction area that is a predetermined multiple, m, of the conduction area of transistor 124, transistor 140 will conduct an amplified current of approximately m*i through its drain. The conduction area m of transistor 140 may be unity, in which case transistor 140 will conduct a current of approximately i through its drain.

Transistor 150 has a conduction area that is a predetermined multiple, n, of the conduction area of transistor 140. Thus, transistor 150 will draw an amplified current of approximately m*n*i through its drain. Although the embodiment of FIG. 5 illustrates an n-channel input differential amplifier and an n-channel current mirror, a p-channel input differential amplifier and a p-channel current mirror may be employed with minor modifications to the circuit shown in FIG. 5.

Figure 6:
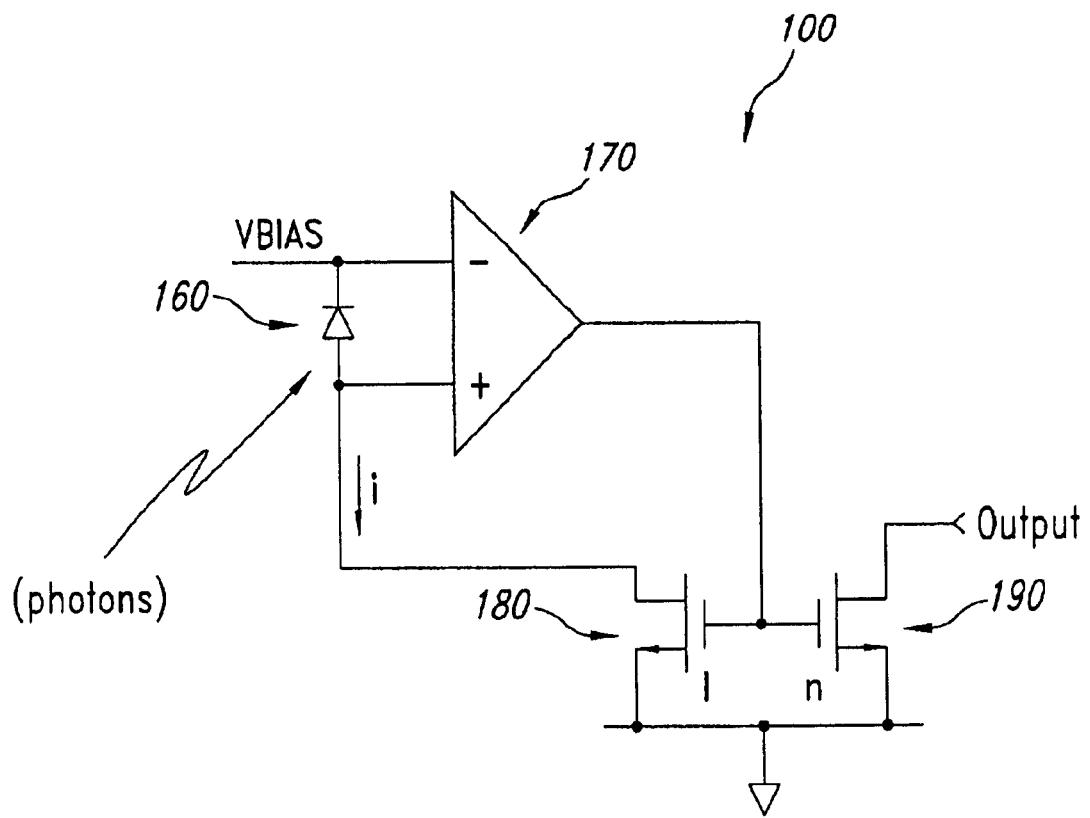
FIG. 6 represents another embodiment of a current amplifier according to the present invention.

Another embodiment of the present invention is illustrated in FIG. 6. An input current i to be amplified is provided at a first input of an amplifier circuit 170. A reference voltage, such as $V_{bias}$, is applied to a second input of the amplifier circuit 170. Negative feedback is provided by a negative feedback loop comprising an n-channel transistor 180. The gate of transistor 180 is coupled to the output of the amplifier circuit 170. The drain of transistor 180 is coupled to the first input of the amplifier circuit 180. The source of transistor 180 is coupled to a reference voltage, such as ground. Transistor 180 will draw a current of i through its drain.

The gate of transistor 180 is coupled to the gate of an n-channel transistor 190. The source of transistor 180 is coupled to the source of transistor 190. Transistor 190 has the same operational characteristics as transistor 180. Transistor 190, however, has a conduction area that is a predetermined multiple, n, of the conduction area of transistor 180. Thus, transistor 190 will ideally draw an amplified current of n*i through its drain.

In one embodiment, photodiode 160 is the current source to supply current i based on an optical input signal. In this case, the diode 160 may be coupled between the inputs of the amplifier circuit 170.

All these embodiments have shunt negative feedback which significantly reduces the real part of the input impedance. This allows wide bandwidth performance because the input pole has been significantly pushed out. The embodiment of FIG. 6 has no limitation of bandwidth even when a large multiplication factor, n, is used, adding capacitance at the gates of transistors 180 and 190 due to the size of transistor 190.

FIGS. 4 through 6 illustrate circuits for amplifying current from a photodiode of a CD read head. The current i can be generated by any other current input circuit whose value is to be measured. Thus, the current invention is not limited to current amplification of a signal received from a photodiode in a CD read head.

The current amplifier according to the invention is advantageously realized in CMOS technology, which allows its integration with a digital signal processing circuit, in particular for signals from photodiodes of a CD read head. However, for other applications, the current amplifier according to the invention can also be realized in bipolar technology.

Equivalents of the output circuits of FIGS. 4, 5 and 6 may be employed, such as a Wilson current mirror circuit or its equivalent.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A current amplifier circuit comprising:
    first and second current input terminals to receive a first current;
    an operational amplifier having a non-inverting input terminal coupled to a bias voltage and the second current input terminal, an inverting input terminal coupled to the first current input terminal, and an output terminal to provide an output of the operational amplifier;
    a current mirror amplifier having an amplification factor, an input terminal and an output terminal and configured to provide an amplified output current that is the product of the first current and the amplification factor of the current mirror amplifier; and
    a transistor connected between the inverting input terminal of the operational amplifier and the input terminal of the current mirror amplifier, wherein the transistor is controlled by the output of the operational amplifier.

2. The current amplifier of claim 1, wherein the operational amplifier is comprised of MOS transistors.

3. The current amplifier of claims 1, wherein the current mirror amplifier is comprised of MOS transistors.

4. The current amplifier circuit of claim 1, wherein the current mirror amplifier comprises a Wilson current mirror.

5. The current amplifier of claim 1, wherein the transistor is an MOS transistor.

6. The current amplifier of claim 1, further comprising a photodiode coupled to the first and second current input terminals to generate the first current.

7. The current amplifier of claim 1, further comprising a CD read head coupled to the first and second current input terminals to generate the first current.

8. The current amplifier of claim 7, further comprising CD signal processing circuitry, wherein the current amplifier and the CD signal processing circuitry are integrated onto an integrated circuit.

9. A current amplifier comprising:
   a differential amplifier having MOS input transistors of a first conductivity type, a non-inverting input terminal coupled to a bias voltage, an inverting input terminal coupled to an input current, and an output terminal;
   a first MOS transistor of a second conductivity type and a second MOS transistor of the first conductivity type, the first and second MOS transistors each having a control gate, wherein the control gate of the first MOS transistor is coupled to the output terminal of the differential amplifier, the first MOS transistor is connected between a first reference voltage and the control gate of the second MOS transistor, and the second MOS transistor is connected between the inverting input terminal of the differential amplifier and a second reference voltage; and
   a current mirror amplifier having an input terminal coupled to the control gate of the second MOS transistor, and an output terminal to provide an amplified output current.

10. The current amplifier of claim 9 wherein the current mirror amplifier comprises a Wilson current mirror.

11. The current amplifier of claim 9 wherein the MOS input transistors of the differential amplifier are n-channel transistors, the first MOS transistor is a p-channel transistor, the first reference voltage is a supply voltage and the second reference voltage is a ground.

12. The current amplifier of claim 9, further comprising a photodiode to generate the input current for the differential amplifier.

13. The current amplifier of claim 9, further comprising a CD read head to generate the input current for the differential amplifier.

14. A current amplifier comprising:
   a first input terminal to receive a current;
   a second input terminal to receive a bias voltage;
   a first MOS transistor of a first conductivity type having a control gate coupled to the first input terminal;
   a second MOS transistor of the first conductivity type having a control gate coupled to the second input terminal;
   a constant current source having a first terminal and a second terminal, wherein the first MOS transistor is connected between the first terminal of the constant current source and a first node;
   a third and a fourth MOS transistor of a second conductivity type and each having a control gate, wherein the second MOS transistor is connected between the first terminal of the constant current source and the control gates of the third and fourth MOS transistors, the third MOS transistor is connected between the first node and a reference voltage, and the fourth MOS transistor is connected between the control gate of the fourth MOS transistor and the reference voltage;
   a fifth MOS transistor of the second conductivity type and having a control gate, wherein the control gate of the fifth MOS transistor is coupled to the first node;
   a sixth MOS transistor of the first conductivity type, wherein the fifth MOS transistor is connected between the control gate of the sixth MOS transistor and the reference voltage, and the sixth MOS transistor is connected between the first input terminal and the second terminal of the constant current source; and
   a current mirror amplifier having an input terminal coupled to the gate of the sixth MOS transistor and an output terminal.

15. The current amplifier of claim 14, wherein the first and second MOS transistors are n-channel MOS transistors.

16. The current amplifier of claim 14, wherein the current mirror amplifier comprises a Wilson current mirror.

17. A current amplifier comprising:
   first and second current input terminals to receive a first current to be amplified;
   an operational amplifier having a low impedance inverting input terminal coupled to the first current input terminal, a non-inverting input terminal coupled to the second current input terminal, and an output terminal;
   a feedback loop comprising a transistor, the feedback loop being connected between the output terminal and the inverting input terminal of the operational amplifier; and
   a current mirror having an amplification factor, an input terminal to receive a current conducted through the transistor in the feedback loop and an output terminal to provide an amplified output current that is the product of the first current to be amplified and the amplification factor of the current mirror, the input terminal of the current mirror being coupled to the transistor.

18. The current amplifier of claim 17, wherein the operational amplifier is comprised of MOS transistors.

19. The current amplifier of claim 17, wherein the current mirror amplifier comprises a Wilson current mirror.

20. A current amplifier comprising:
   a current input terminal to receive a current to be amplified;
   a voltage amplifier circuit having a first input terminal coupled to the current input terminal, a second input terminal and an output terminal;
   a feedback loop having overall negative feedback coupled between the output terminal and the first input terminal of the voltage amplifier circuit; and
   a current amplifier circuit coupled to the feedback loop through a continuous current path, the continuous current path conducting a current proportional to the current to be amplified, and having an output terminal providing an output current proportional to the current to be amplified.

21. The current amplifier of claim 20 wherein the feedback loop comprises a p-channel MOS transistor.

22. The current amplifier of claim 20 wherein the feedback loop comprises an n-channel MOS transistor.

23. The current amplifier of claim 20 wherein the current amplifier circuit comprises a CMOS transistor.

24. The current amplifier of claim 20 wherein the current amplifier circuit composes a current mirror.

25. The current amplifier of claim 24 wherein the current mirror is a Wilson current mirror.

26. A method of amplifying a current signal, the method comprising:
   conducting the current signal between first and second inputs of an amplifier;

receiving a bias voltage signal at the second amplifier input;

providing negative feedback to the first amplifier input using a first transistor and a second transistor;

conducting a current of a predetermined multiple of the current of the current signal through the second transistor; and generating an amplified current using an output transistor coupled to the second transistor, the amplified output current being a predetermined multiple of the current conducted through the second transistor.

27. The method of claim 26, wherein the step of generating an amplified current comprises mirroring in the output transistor the current flow through the second transistor.

28. The method of claim 26, comprising generating the current signal in response to data patterns detected in a compact disk by a read head.

29. The method of claim 26, further comprising integrating a signal processing circuit and a current amplifier circuit in a single integrated circuit.

30. A current amplifier circuit comprising:

first and second input terminals to receive a first current to be amplified;

an operational amplifier having a non-inverting input terminal coupled to a reference voltage and to the second input terminal, an inverting input terminal coupled to the first input terminal and an output terminal;

a current input circuit coupled to the first and second input terminals;

a feedback circuit having a control terminal coupled to the output terminal of the operational amplifier, a first terminal coupled to the inverting input terminal of the operational amplifier and a second terminal; and a current mirror circuit having its input connected to the second terminal of the feedback circuit and having an output terminal providing an output of the current amplifier circuit, wherein the feedback circuit is configured to maintain a substantially zero bias voltage across the current input circuit and the output of the current amplifier is proportional to the first current to be amplified.

31. The current amplifier circuit of claim 30 wherein the feedback circuit includes an MOS transistor having a gate coupled to the output terminal of the operational amplifier, a first source/drain coupled to the inverting input terminal of the operational amplifier and a second source/drain coupled to the input of the current mirror circuit.

32. The current amplifier circuit of claim 30 wherein the current input circuit includes a photo diode having one terminal coupled to the first input terminal.

33. The current amplifier circuit of claim 32 wherein the photo diode has a second terminal coupled to the second input terminal.

34. A current amplifier circuit comprising:

an operational amplifier having an inverting input terminal coupled to a reference voltage, a non-inverting input terminal and an output terminal;

a current input circuit coupled to the inverting and the non-inverting input terminals of the operational amplifier;

a negative feedback circuit having a control terminal coupled to the output terminal of the operational amplifier, a first conduction terminal coupled to the non-inverting input of the operational amplifier and a second conduction terminal; and an output circuit having a control terminal coupled to the control terminal of the feedback circuit, a first terminal coupled to the second conduction terminal of the feedback circuit and an output terminal providing an output current of the current amplifier circuit proportional to a current generated by the current input circuit.

35. A method of amplifying a current signal, the method comprising:

receiving a current signal from a photo-sensitive device;

conducting the current signal between a low impedance amplifier input and a second amplifier input;

receiving a bias voltage at the second amplifier input;

providing negative feedback to the low impedance amplifier input by conducting a current substantially equal to the current of the current signal through a first transistor so as to maintain a substantially zero bias voltage across the photo-sensitive device; and generating an amplified current using an output transistor coupled to the first transistor, the amplified output current being a predetermined multiple of the current conducted through the first transistor.

36. A method of amplifying a current signal, the method comprising:

receiving a current signal from a photo-sensitive device;

conducting the current signal between a low impedance amplifier input and a second amplifier input;

receiving a bias voltage at the second amplifier input;

providing negative feedback to the low impedance amplifier input by conducting a current substantially equal to the current of the current signal through a first transistor so as to maintain a substantially zero bias voltage across the photo-sensitive device; and generating an amplified current using a current mirror coupled to the first transistor, the amplified output current being a predetermined multiple of the current conducted through the first transistor.

37. A current amplifier circuit comprising:

first and second input terminals for coupling to a photo-sensitive device;

an operational amplifier having a non-inverting input terminal coupled to a bias voltage and to the first input terminal, an inverting input terminal coupled to the second input terminal, and an output terminal to provide an output of the operational amplifier;

a current mirror amplifier having an input terminal and an output terminal to provide an amplified output current proportional to a current conducted between the first and second input terminals; and a transistor connected between the inverting input terminal of the operational amplifier and the input terminal of the current mirror amplifier, wherein the transistor is controlled by the output of the operational amplifier and the current amplifier circuit is configured to maintain a substantially zero bias voltage across the photo-sensitive device.

38. A current amplifier comprising:

a differential amplifier having MOS input transistors of a first conductivity type, a non-inverting input terminal coupled to a bias voltage, an inverting input terminal coupled to an input current, and an output terminal;

a first MOS transistor of a second conductivity type and a second MOS transistor of the first conductivity type, the first and second MOS transistors each having a control gate, wherein the control gate of the first MOS transistor is coupled to the output terminal of the differential amplifier, the first MOS transistor is connected between a first reference voltage and the control gate of the second MOS transistor, and the second MOS transistor is connected between the inverting input terminal of the differential amplifier and a second reference voltage; and a current mirror amplifier having an input terminal coupled to the control gate of the second MOS transistor, and an output terminal to provide an output current proportional to the input current.

39. A method of amplifying a current signal, the method comprising:

coupling a photo-sensitive device across first and second input terminals of an operational amplifier;

maintaining a substantially zero bias voltage across the photo-sensitive device by applying negative feedback through a feedback loop to the first terminal of the operational amplifier; and conducting a current substantially equal to current conducted through the photo-sensitive device through a first transistor of a current mirror circuit, wherein the first transistor of the current mirror circuit is coupled to the first terminal of the operational amplifier through a continuous current path.

40. The method of claim 39, wherein a control terminal of the first transistor is coupled to an output terminal of the operational amplifier and a current carrying terminal of the first transistor is coupled to the first terminal of the operational amplifier.

41. The method of claim 39, further comprising amplifying the current conducted through the first transistor.

42. The method of claim 39, wherein the feedback loop comprises a second transistor and a current substantially equal to the current conducted through the first transistor is conducted through the second transistor.

43. A current amplifier circuit comprising:

first and second input terminals for receiving an input current from a photo-sensitive device;

an operational amplifier having a first input coupled to a bias voltage and the first input terminal, a second input coupled to the second input terminal, and an output to provide an output of the operational amplifier; and a current mirror having an input terminal coupled through a continuous current path to the second input of the operational amplifier, a control terminal coupled to the output of the operational amplifier, and an output terminal to provide an amplified output current proportional to the input current, wherein the current amplifier circuit is configured to maintain a substantially zero bias voltage across the photo-sensitive device.

44. The current amplifier circuit of claim 43 wherein the control terminal of the current mirror is directly connected to the output of the operational amplifier.

45. The current amplifier circuit of claim 43 wherein the input terminal of the current mirror is directly connected to the second input of the operational amplifier.

46. The current amplifier of claim 45 wherein the control terminal of the current mirror is directly connected to the output of the operational amplifier.

47. The current amplifier circuit of claim 43, further comprising a transistor connected between the input terminal of the current mirror and the second input of the operational amplifier, wherein a control terminal of the transistor is connected to the output of the operational amplifier and the control terminal of the current mirror is coupled to the input terminal of the current mirror.

48. The current amplifier circuit of claim 43 wherein the photo-sensitive device comprises a photo-diode.

* * * * *